US009711594B2

(12) United States Patent
Lee et al.

(10) Patent No.: US 9,711,594 B2
(45) Date of Patent: Jul. 18, 2017

(54) IMPROVING LINEARITY IN SEMICONDUCTOR DEVICES

(71) Applicant: Massachusetts Institute of Technology, Cambridge, MA (US)

(72) Inventors: Dong Seup Lee, Farmers Branch, TX (US); Tomas Apostol Palacios, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/838,401

(22) Filed: Aug. 28, 2015

(65) Prior Publication Data
US 2015/0372081 A1    Dec. 24, 2015

Related U.S. Application Data

(63) Continuation of application No. PCT/US2014/019520, filed on Feb. 28, 2014.
(Continued)

(51) Int. Cl.
*H01L 29/06* (2006.01)
*H01L 29/66* (2006.01)
(Continued)

(52) U.S. Cl.
CPC ......... *H01L 29/0673* (2013.01); *B82Y 10/00* (2013.01); *H01L 29/0649* (2013.01); *H01L 29/0657* (2013.01); *H01L 29/2003* (2013.01); *H01L 29/42316* (2013.01); *H01L 29/66469* (2013.01); *H01L 29/775* (2013.01); *H01L 29/7786* (2013.01); *H01L 29/7787* (2013.01)

(58) Field of Classification Search
CPC ............ H01L 29/0673; H01L 29/2003; H01L 29/7787; H01L 29/775; H01L 29/42316; H01L 29/4236; H01L 29/402; H01L 29/66469; H01L 29/7786; H01L 29/0649; H01L 29/0657; B82Y 10/00
USPC .......................................................... 257/76
See application file for complete search history.

(56) References Cited

U.S. PATENT DOCUMENTS 4,996,574 A    2/1991  Shirasaki
6,413,802 B1   7/2002  Hu et al.
(Continued)

FOREIGN PATENT DOCUMENTS

WO    WO 2012/050873 A2    4/2012

OTHER PUBLICATIONS

Disanto et al., At-Bias Extraction of Access Parasitic Resistances in AlGaN/GaN HEMT's : Impact on Device Linearity and Channel Electron Velocity. IEEE Tran. Electron. Devices. Dec. 2006;53(12):2914-9.
(Continued)

*Primary Examiner* — Walter H Swanson
(74) *Attorney, Agent, or Firm* — Wolf, Greenfield & Sacks, P.C.

(57) ABSTRACT

A field effect transistor that has a source, a drain, a gate and a semiconductor region. The semiconductor region has a source access region between the gate and the source, a drain access region between the gate and the drain, and a channel region under the gate. The channel region under the gate has a maximum current-carrying capability that is lower than a maximum current-carrying capability of the source access region.

25 Claims, 13 Drawing Sheets

Related U.S. Application Data

(60) Provisional application No. 61/770,383, filed on Feb. 28, 2013.

(51) Int. Cl.
  *H01L 29/775* (2006.01)
  *H01L 29/778* (2006.01)
  *H01L 29/20* (2006.01)
  *B82Y 10/00* (2011.01)
  *H01L 29/423* (2006.01)

(56) References Cited

U.S. PATENT DOCUMENTS

| | | | |
|---|---|---|---|
| 6,605,847 B2 | 8/2003 | Kim et al. | |
| 7,638,842 B2 | 12/2009 | Currie et al. | |
| 8,198,621 B2 * | 6/2012 | Rogers | B82Y 10/00 257/40 |
| 2004/0063286 A1 | 4/2004 | Kim et al. | |
| 2006/0091481 A1 | 5/2006 | Li et al. | |
| 2007/0176227 A1 | 8/2007 | Liu et al. | |
| 2008/0258150 A1 * | 10/2008 | McCarthy | H01L 21/26546 257/76 |
| 2011/0133205 A1 * | 6/2011 | Nagahisa | H01L 29/4236 257/76 |
| 2012/0153300 A1 * | 6/2012 | Lidow | H01L 21/743 257/77 |
| 2013/0214332 A1 | 8/2013 | Wu | |

OTHER PUBLICATIONS

Trew et al., Nonlinear Source Resistance in High-Voltage Microwave AlGaN/GaN HFETs. IEEE Trans. Micro. Theory Tech. 2006;54(5): 2061-7.

International Search Report and Written Opinion mailed Jun. 10, 2014 for Application No. PCT/US2014/019520.

International Preliminary Report on Patentability mailed Sep. 11, 2015 for Application No. PCT/US2014/019520.

Azize et al., High-Electron_Mobility transistors based on INA1N/GaN Nanoribbons. IEE Electron Device Letters. Dec. 2011;32 (12) 1680-2.

Azize et al., Top-down fabrication of AlGaN/GaN nanoribbons. Applied Physics Letters. 2011; 98; 042103. 3 pages.

Ohi et al., Current Stability in Multi-Mesa-Channel AlGaN/GaN HEMTs. IEEE Transactions on Electron Devices. Oct. 2013; 60(10): 2997-3004.

Ohi et al., Drain Current Stability and Controllability of Threshold Voltage and Subthreshold Current in a Multi-Mesa-Channel AlGan/GaN High Electron Mobility Transistor. Japanese Journal of Applied Physics. 2009:48;081002. 5 pages.

Palacios et al., Influence of the Dynamic Access Resistance in the $G_M$ and $f_T$ Linearity of AlGaN/GaN HEMTs. IEEE Transaction on Electron Devices. Oct. 2005; 52(10):2117-23.

Tamura et al., Nearly Temperature-Independent Saturation Drain Current in a Multi-Mesa-Channel AlGan/GaN High Electron Mobility Transistor. Applied Physics Express. 2008: 1; Feb. 30, 2001. 3 pages.

Zimmerman et al., Top-Down AlN/GaN Enhancement-& Depletion-mode Nanoribbon HEMTs. Applied Phys. Exp. 2008:129-30.

* cited by examiner

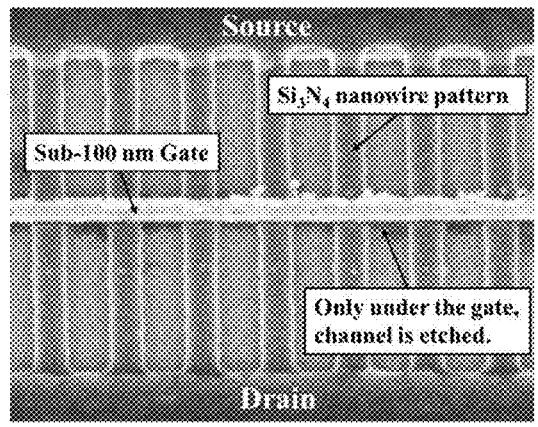
FIG. 10
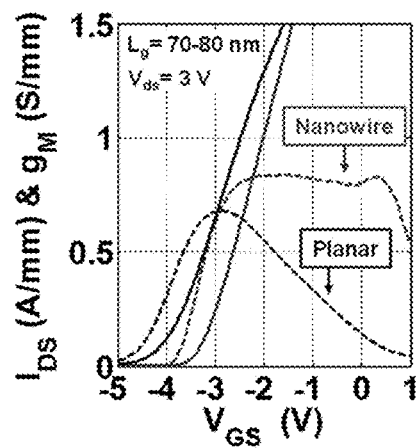 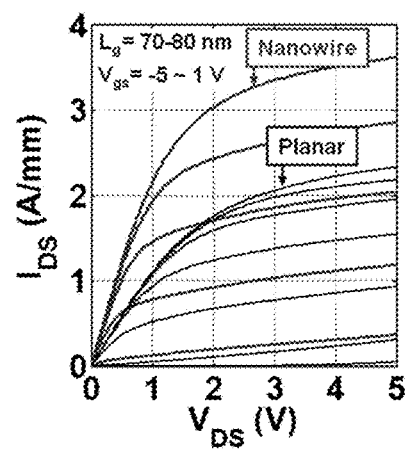
FIG. 11A  FIG. 11B
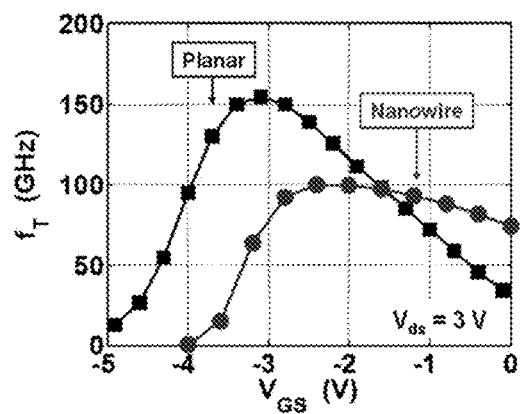
FIG. 12

IMPROVING LINEARITY IN SEMICONDUCTOR DEVICES

CROSS-REFERENCE TO RELATED APPLICATIONS

This application is a continuation of International Application Serial No. PCT/US2014/019520, titled "Improving Linearity in Semiconductor Devices," filed Feb. 28, 2014, which claims priority to U.S. provisional application Ser. No. 61/770,383, titled "Structure and Process Technology for High Linearity in GaN Transistors," filed Feb. 28, 2013, the contents of which applications are incorporated by reference in their entireties.

STATEMENT REGARDING FEDERALLY SPONSORED RESEARCH OR DEVELOPMENT

This invention was made with Government support under Grant No. ECCS-0846628 awarded by the National Science Foundation and under Grant No. N00014-12-1-0959 awarded by the Office of Naval Research. The Government has certain rights in the invention.

BACKGROUND

1. Field of Invention

The technology described herein relates to semiconductor devices, and particularly to improving the linearity of semiconductor devices, such as nitride semiconductor devices, for example.

2. Discussion of the Related Art

Semiconductor devices, such as transistors, have been formed using different types of semiconductor materials, such as group IV semiconductor materials, group III-V semiconductor materials, and group II-VI semiconductor materials. Nitride semiconductor materials are a class of III-V semiconductor materials that has been investigated recently. Gallium nitride (GaN) in particular has been investigated due to its unique combination of high electron mobility and large critical electric field. Due to these material properties, GaN-based transistors have been viewed as promising for high power and high frequency applications.

SUMMARY

Some embodiments relate to a field effect transistor that has a source, a drain, a gate having a gate length of less than 400 nm and a semiconductor region. The semiconductor region has a source access region between the gate and the source, a drain access region between the gate and the drain, and a channel region under the gate. The channel region under the gate has a maximum current-carrying capability that is lower than a maximum current-carrying capability of the source access region and a current carrying capability of the drain access region.

Some embodiments relate to a field effect transistor having a first electrode, a second electrode and a gate having a gate length of less than 400 nm. The field effect transistor also has a first region of semiconductor material covered by the gate and a second region of semiconductor material not covered by the gate, positioned between the first electrode and the gate. The first region has a first cross-section perpendicular to a line between the first electrode and the second electrode and a first current-carrying area defined by the first cross-section. The second region has a second cross-section perpendicular to the line between the first electrode and the second electrode and a second current-carrying area defined by the second cross-section. The first current-carrying area is smaller than the second current-carrying area.

Some embodiments relate to a method of forming a field effect transistor described herein.

Some embodiments relate to a method of operating a field effect transistor described herein.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques described herein.

FIG. 10 is an SEM image after gate metallization in a prototype of a semiconductor device with nanowires under the gate.

FIGS. 11A and 11B are plots of the current and transconductance characteristics vs. $V_{gs}$ and $V_{ds}$, respectively, for a conventional planar semiconductor device and a prototype of a nanowire channel device.

FIG. 12 is a plot of the cutoff frequency versus $V_{gs}$ for examples of a conventional planar channel device and a nanowire channel device.

DETAILED DESCRIPTION

For the last two decades, the performance of GaN-based transistors has been improved significantly through improved material quality and new process technologies. However, the performance of state-of-art GaN-based transistors remains below theoretical expectations based on GaN material properties. One problem, particularly for large-signal RF operation, is the non-linear behavior of short-channel GaN transistors. In conventional GaN devices, the extrinsic transconductance ($g_m$) drops quickly with increasing drain current after the extrinsic transconductance reaches a maximum point. This problem becomes more serious as the gate length scales down. The $g_m$ roll-off at high drain current not only deteriorates the linearity in large-signal operation, but also limits the maximum operating frequency. In previous research, it has been shown that a non-constant access resistance (two-dimensional electron gas (2-DEG) resistance) is the main cause of this behavior because it increases rapidly with an increase in current. Use of a highly-doped source/drain contact and a self-aligned gate structure can reduce this problem, but it results in a serious degradation of the breakdown voltage.

In a field effect transistor, the current that flows through the transistor is modulated by the voltage applied to the gate. Increasing the range of gate voltages for which a semiconductor device operates linearly can allow operating at higher voltages with reduced distortion, and may enable large-signal operation.

Figure 1A:
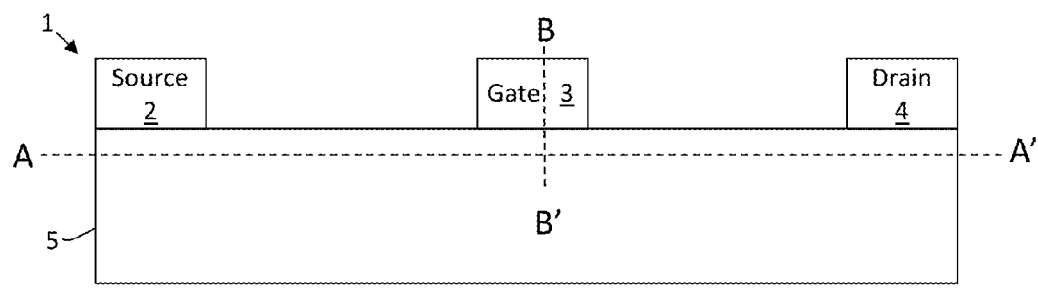
FIGS. 1A, 1B, and 1C show a semiconductor device having a channel with a uniform width.

FIG. 1A shows a cross-section of a conventional field effect transistor 1 having a source 2, a gate 3, a drain 4 and a semiconductor region 5. Depending on the voltage applied to the gate 3 (e.g., a gate-source voltage $V_{gs}$), a channel is formed in the semiconductor region 5 and current flows through a channel between the source 2 and the drain 4. The current that flows between the source 2 and the drain 4 is termed the source-drain current $I_{sd}$.

Figure 1B:
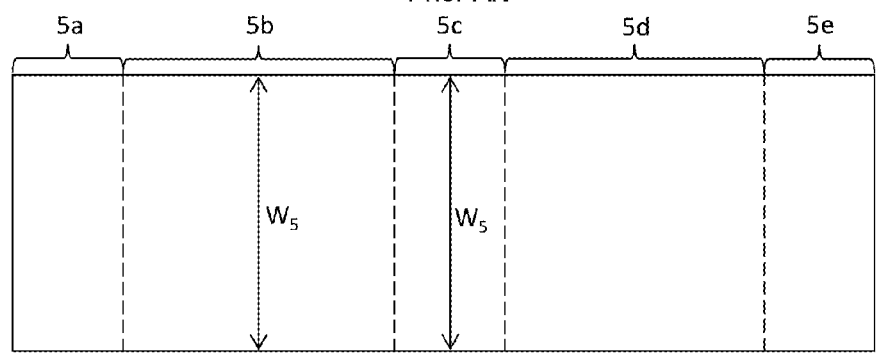
Figure 1C:
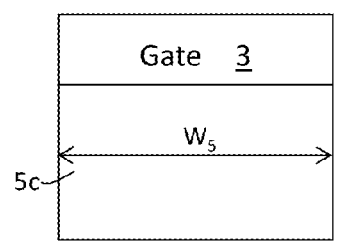

A plan view of the field effect transistor 1 along the line A-A' is shown in FIG. 1B. A cross-sectional view of the field effect transistor 1 along the line B-B' is shown in FIG. 1C. FIG. 1B shows portions of the semiconductor region 5 that correspond to the region under the source 5a, source access region 5b, region under the gate 5c, drain access region 5d, and region under the drain 5e, which have the same widths, $W_5$. In field effect transistor 1, the channel has the same width, $W_5$, throughout the length of the transistor between the source 2 and the drain 4. As shown in FIG. 1B, each of regions 5a-5e has the same width $W_5$.

Figure 2:
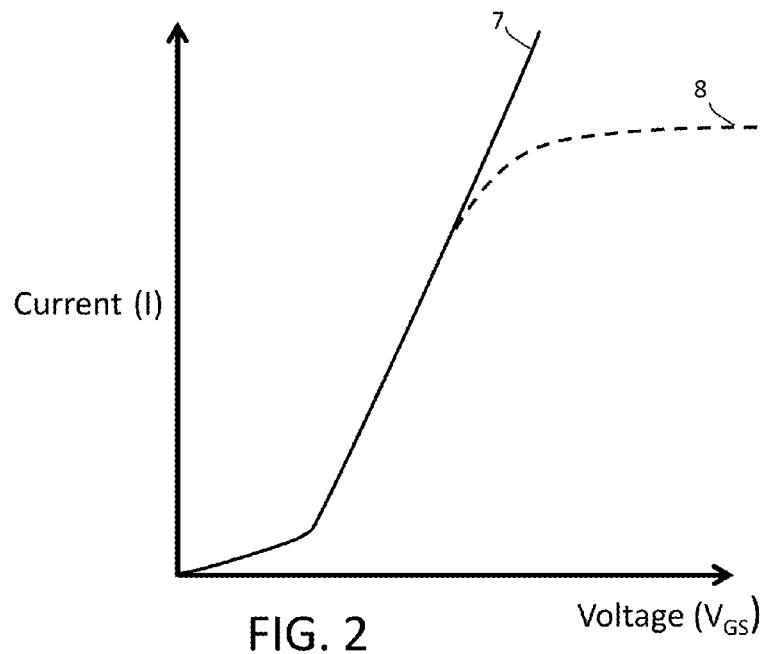
FIG. 2 shows the relationship between current and gate-source voltage for an ideal transistor and a transistor with non-linear behavior.

In an ideal field effect transistor, the relationship between the gate-source voltage $V_{gs}$ and source-drain current $I_{sd}$ is linear above a certain voltage, as shown by curve 7 in FIG. 2. However, as discussed above, conventional short-channel nitride semiconductor transistors exhibit non-linear behavior above a certain gate-source voltage ($V_{gs}$). The behavior of a conventional short-channel nitride semiconductor transistor is shown by curve 8 in FIG. 2. Curve 8 shows that the conventional short-channel nitride semiconductor transistor operates linearly at low $V_{gs}$, but at a high enough $V_{gs}$ the transistor operates non-linearly, and may reach an upper limit where the source-drain current $I_{sd}$ no longer increases with increasing gate-source voltage $V_{gs}$. When a conventional short-channel nitride semiconductor transistor is operated in a range of gate-source voltages that results in non-linear operation of the transistor, the output signal may be distorted, which may be undesirable in many applications. To avoid distortion, the conventional short-channel nitride semiconductor transistor may be operated in the linear range of operation. However, doing so limits the range of gate-source voltages over which the transistor operates.

Figure 3:
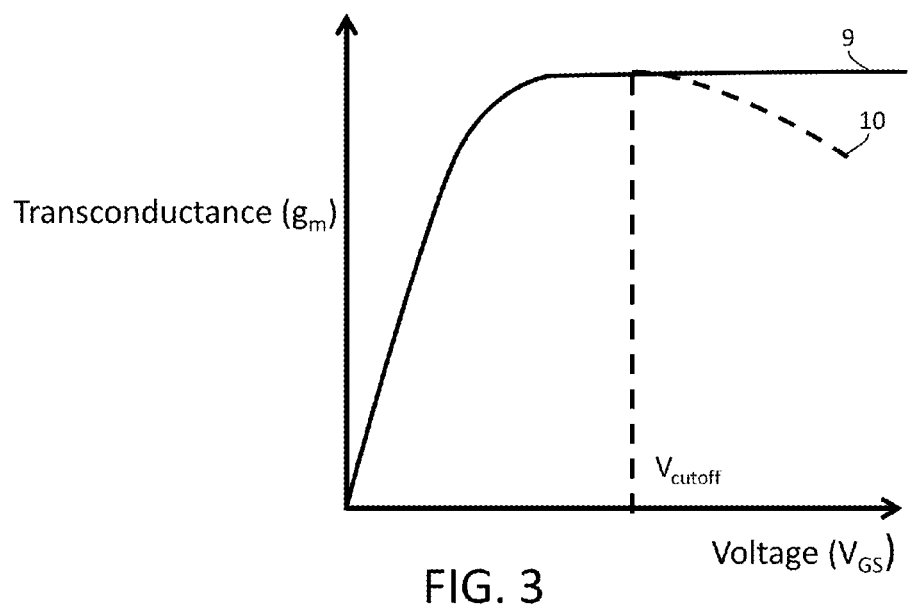
FIG. 3 shows the relationship between transconductance and gate-source voltage for an ideal transistor and a transistor with non-linear behavior.

Such non-linear behavior above a certain gate-source voltage $V_{gs}$ is also apparent when examining the transconductance of the transistor. The transconductance, $g_m$, is the slope of the current as a function of voltage. When the transconductance is constant the transistor behaves linearly. The transconductance of an ideal transistor, shown by curve 9 in FIG. 3, is constant beyond a certain source-gate voltage $V_{gs}$. The transconductance of a conventional short-channel nitride semiconductor transistor, shown by curve 10, is constant over a range of voltage values, but for gate-source voltages $V_{gs}$ higher than a cutoff voltage $V_{cutoff}$, the transconductance decreases with increasing gate-source voltages $V_{gs}$. Such nonlinear behavior for conventional short-channel nitride semiconductor transistors is caused by current limitations in various regions of the channel.

Current depends on the number of electrons, n, and the velocity of the electrons, $v_c$, based on the equation $I=qnv_c$, where q is the charge of an electron. Varying the gate-source voltage $V_{gs}$ changes the number of electrons, n, within the region under the gate 5c. When the gate-source voltage $V_{gs}$ increases, the number of electrons within region 5c also increases.

Figure 4:
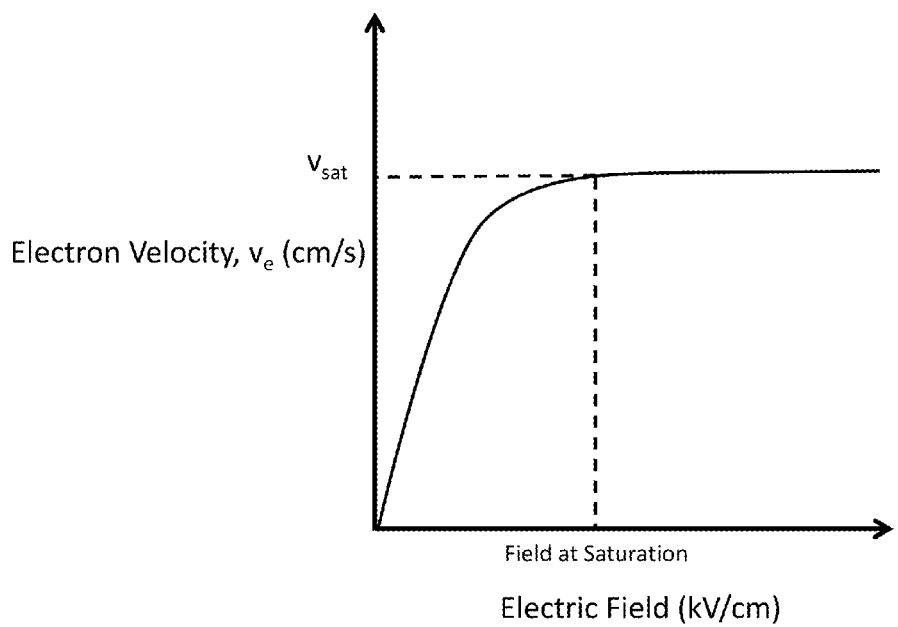
FIG. 4 shows the relationship between electron velocity and electric field in a field effect transistor.

An example of the relationship between electron velocity and electric field strength is shown in FIG. 4. The electron velocity increases with increasing electric field strength until a saturation velocity ($v_{sat}$) is reached. Different semiconductor materials have different saturation velocities. In GaN, for example, electrons reach a saturation velocity of $1.5 \times 10^7$ cm/s at an electric field of 100 kV·cm. Above a certain gate-source voltage, the electric field under the gate is high enough that the electrons under the gate should travel at the saturation velocity and the current within region 5c should be $I=qnv_{sat}$. However, it has been appreciated that the current in region 5c cannot reach $I=qnv_{sat}$ because it is limited by the number of electrons provided by the source access region 5b.

The current in the source access region 5b and the drain access region 5d is also governed by the equation $I=qnv$. The electric field in the source access region 5b is lower than that of region 5c, as the source access region 5b is not covered by the gate. Due to the lower electric field, the electrons in the source access region 5b may not reach the saturation velocity $v_{sat}$. As a result, the maximum current that can flow through regions 5b is lower than the maximum current that can flow through region 5c.

Since regions 5b, 5c, and 5d are in series, the current through these regions is equal (this concept is termed "current continuity"). The source-drain current of the transistor is thus limited by the maximum current that can flow through the source access region 5b. At low gate-source voltages, the number of electrons under the gate may be at a value where the source access region 5b and the drain access region 5d do not limit the current the current in the channel. However, for gate-source voltages above the cutoff voltage $V_{cutoff}$, the source-drain current becomes limited by the limited current-carrying capacity of the source access region 5b, which produces the non-linear behavior shown in FIGS. 2 and 3.

According to the innovative techniques described herein, an improvement in the linearity of field effect transistors can be achieved by limiting the amount of current that can flow under the gate to prevent the source-drain current $I_{sd}$ of the transistor from being limited by the current-carrying capability of the source access region or the drain access region. Any of a variety of techniques may be used to limit the current that can flow in the region under the gate. In some embodiments, the amount of current-carrying semiconductor material (e.g., of the channel) under the gate may be reduced so that the source-drain current $I_{sd}$ is limited by the amount of current-carrying semiconductor material under the gate, rather than being limited by the current-carrying capability of the source access region or the drain access region.

Figure 5A:
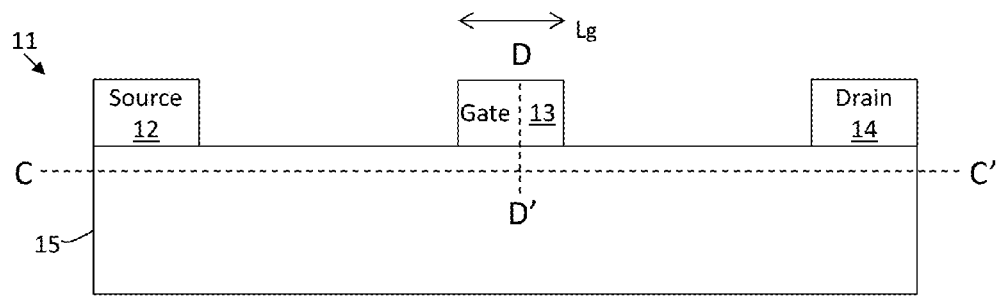
FIGS. 5A, 5B, 5C, 5D, 5E and 5F show a semiconductor device having a channel with a smaller width for a region under the gate than the rest of the channel.
Figure 5B:
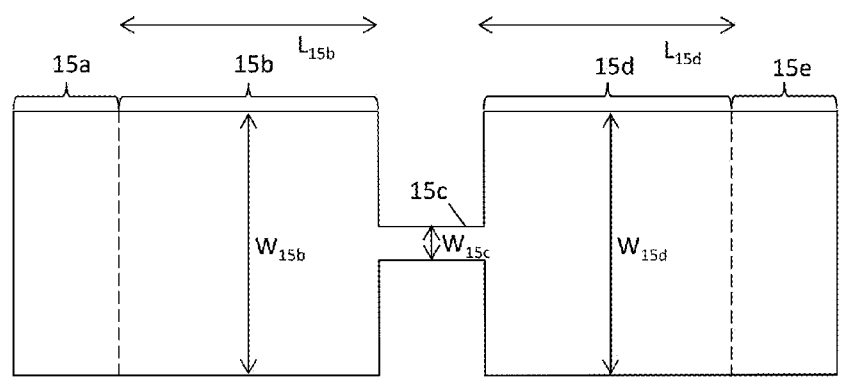

FIGS. 5A-5F show a field effect transistor 11 having a limited amount of current-carrying semiconductor material under the gate, according to some embodiments. FIG. 5A shows a cross-sectional view of the field effect transistor 11. Field effect transistor 11 has a source 12, a gate 13, a drain 14 and a semiconductor region 15. FIG. 5B shows a plan view of the field effect transistor 11 along the line C-C' of FIG. 5A. As shown in FIG. 5B, the semiconductor region 15 includes the region under the source 15a, source access region 15b, region under the gate 15c, drain access region 15d, and region under the drain 15e.

As shown in FIG. 5B, the region 15c under the gate has a smaller width, $W_{15c}$, than the width, $W_{15b}$ of the source access region 15b and the drain access region 15d. The channel thus has a smaller width in region 15c under the gate than in source access region 15b and drain access region 15d, and thus the cross-sectional area of the channel in region 15c under the gate is less than in source access region 15b and drain access region 15d. In some embodiments, the cross-sectional area of the channel in region 15c is small enough such that the source-drain current $I_{sd}$ in the field effect transistor 11 is limited by the cross-sectional area of the channel in region 15c and not limited by the current-carrying capability of the source access region 15b or the drain access region 15d. In some embodiments, field effect transistor 11 behaves linearly over a broader range of voltages (e.g., at higher gate-source voltages) than field effect transistor 1.

Figure 5C:
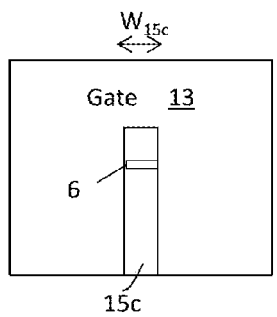

A cross-sectional view of the field effect transistor 11 along line D-D', according to some embodiments, is shown in FIG. 5C. As shown in FIG. 5C, a portion of the gate 13 may be formed over the region 15c and portions of the gate 13 may be formed on the sides of region 15c. Such a gate configuration may be termed a "wrap-around" gate configuration. As shown in FIG. 5C, the channel 6 has a smaller width $W_{15c}$ than the width of the source access region 15b and the drain access region 15d. FIG. 5E shows a perspective cutaway view of an embodiment according to FIG. 5C in which field effect transistor 11 is a HEMT that includes an InAlN/AlN barrier layer formed on a GaN semiconductor layer, thereby forming a two-dimensional electron gas as the channel (dashed line).

Figure 5D:
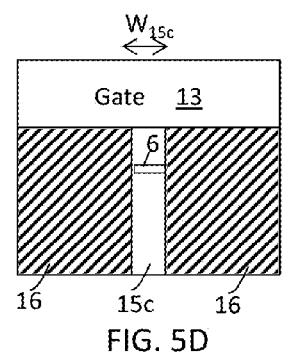
Figure 5E:
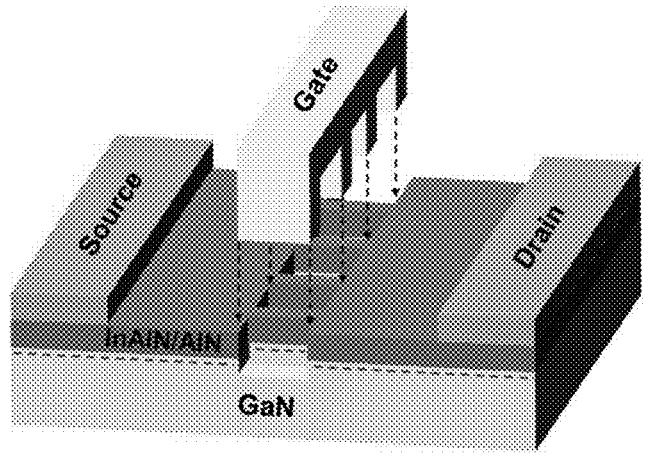

A cross-sectional view of the field effect transistor 11 along line D-D' having a different gate structure, according to some embodiments, is shown in FIG. 5D. As shown in FIG. 5D, the gate 13 may be formed over the region 15c. Such a gate configuration may be termed a "planar gate" configuration. In some embodiments, one or more regions of limited conductivity 16 may be formed on the sides of region 15c. Regions of limited conductivity 16 may include a material having a lower conductivity than the semiconductor material of region 15c and/or the semiconductor material of source access region 15b and/or drain access region 15d. In some embodiments, regions of limited conductivity 16 may be formed of electrically insulating material.

Regions of limited conductivity 16 may be formed in any suitable way. In some embodiments, a portion of the semiconductor material in region 15c may be removed (e.g., etched), and regions 16 may be formed in the region where the semiconductor material was removed. As another example, insulating material may be formed without removing semiconductor material. For example, regions 16 may be formed by damaging semiconductor material of region 15 using ion implantation, or any other suitable process, to degrade the conductivity of the semiconductor material in region 16. Such a technique may lower the fringing capacitance from the sidewall of the channel region.

Figure 5F:
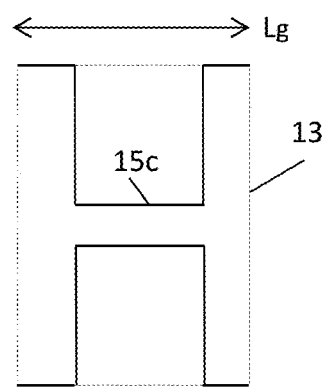

Although region 15c may be aligned with the edge of the gate 13, in some embodiments region 15c is not aligned with the edge of the gate 13. In particular, region 15c, having a smaller width than regions 15b and 15d, need not extend the entire length of the gate, as a region 15c of smaller length is sufficient to limit the current-carrying capability of the region under the gate. FIG. 5F shows an embodiment in which current-carrying region 15c of reduced width only extends for a portion of the length of the gate 13 (shown in dashed lines). Region 15c may not extend beyond the edge of the gate 13 into regions 15b or 15d to prevent limiting the current that can flow in regions 15b and 15d, which may introduce non-linearity.

The techniques described herein may improve the linearity of short-channel transistors, according to some embodiments. Such transistors may have a gate length Lg of less than 550 nm, less than 400 nm, less than 300 nm, less than 250 nm, less than 175 nm, or less than 100 nm, in some embodiments. FIG. 5A illustrates the gate length $L_g$, which is the length of the gate along a dimension extending between the source and the drain. In some embodiments, the gate-drain distance and the gate-source distance may be greater than zero, such that the transistor includes a drain access region and/or a source access region. In some embodiments, the source access region and/or the drain access region may have a length $L_{15b}$, $L_{15d}$, respectively, of at least 50 nm.

Figure 6A:
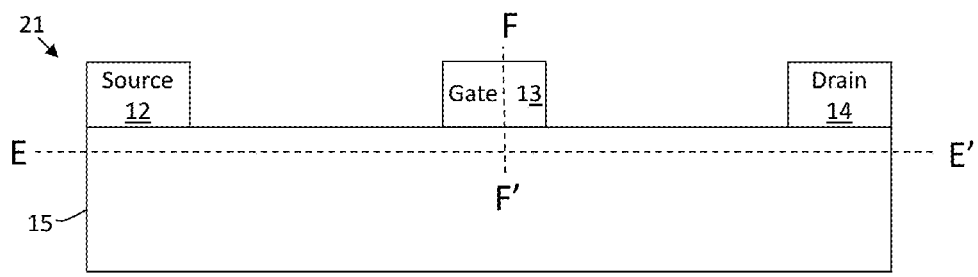
FIGS. 6A, 6B, 6C, and 6D show a semiconductor device having two channel regions under the gate with a total width smaller than the rest of the channel.
Figure 6B:
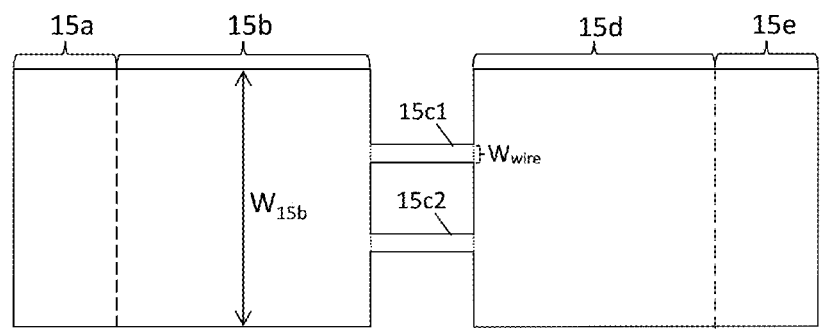

FIGS. 5A-5D and 5F show an embodiment in which a single current-carrying semiconductor region 15c is formed under the gate 13, thereby forming a single channel. In some embodiments, a plurality of current-carrying semiconductor regions may be formed under the gate 13, which may produce a plurality of channels, and which may improve linearity. The plurality of channels under the gate may be parallel to one another, and formed at the same depth from the surface of the substrate. FIGS. 6A-6D show an embodiment of a field effect transistor 21 in which two current-carrying semiconductor regions 15c1 and 15c2 are formed under the gate 13. FIG. 6A shows a cross sectional view and FIG. 6B shows a plan view of the field effect transistor 21 along the line E-E'. In the illustrated embodiment, each of the current-carrying semiconductor regions 15c1 and 15c2 under the gate 13 has a width $W_{wire}$. However, the techniques described herein are not limited to such regions having the same width, as semiconductor regions 15c1 and 15c2 may have different widths. In the illustrated embodiment, the total effective width $W_{eff}$ of the channel under the gate 13 is $W_{eff}=2\ W_{wire}$. $W_{eff}$ is less than the width of the source access region 15b and the drain access region 15d.

Figure 6C:
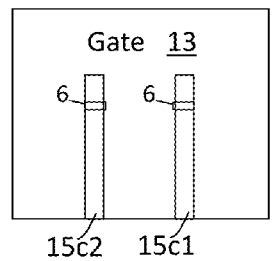
Figure 6D:
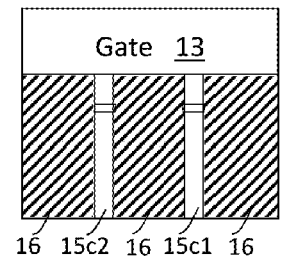

A cross-sectional view of field effect transistor 21 along line F-F', according to an embodiment with a "wrap around" gate, is shown in FIG. 6C. A cross-sectional view of field effect transistor 21 along line F-F', according to an embodiment with a planar gate configuration and regions of limited conductivity 16 is shown in FIG. 6D.

Figure 7A:
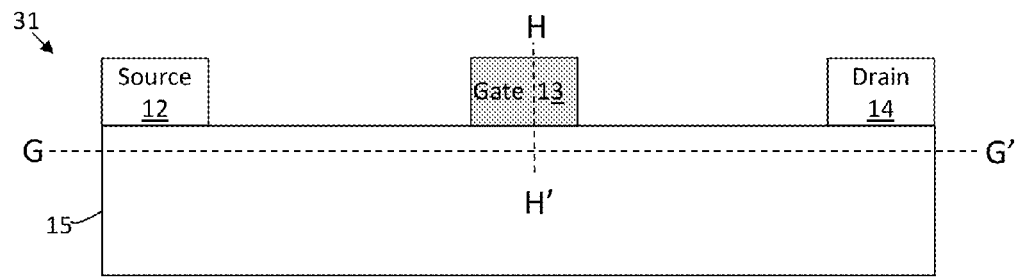
FIGS. 7A, 7B, and 7C show a semiconductor device with multiple channel regions under the gate that have a total width smaller than the rest of the channel.
Figure 7B:
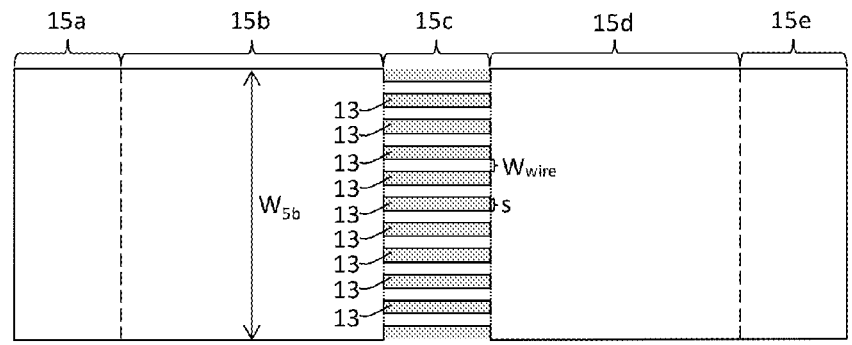

FIGS. 7A-7D show an embodiment of a field effect transistor 31 in which more than two current-carrying regions 15c are formed under the gate 13. FIG. 7A shows a cross sectional view and FIG. 7B shows a plan view of the field effect transistor 31 along the line G-G'.

Increasing the number of current-carrying regions under the gate may improve linearity for some semiconductor devices. In the illustrated embodiment, there are a plurality of current-carrying regions 15c under the gate each having a width $W_{wire}$. However, as discussed above, each of the current-carrying regions need not have the same width. In the example shown in FIG. 7B, there are ten current-carrying regions 15c, however any suitable number of current-carrying regions 15c may be formed. Region 15c has an effective width, $W_{eff}=N_{wire} \times W_{wire}$, where N is the number of current-carrying regions under the gate.

Figure 7C:
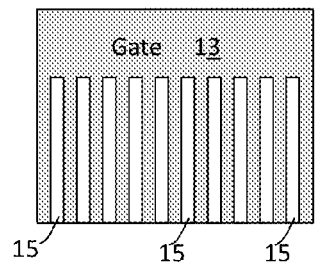

In some embodiments, the current-carrying regions 15c under the gate may be nanowires. The nanowires may not extend beyond an area covered by the gate 13, as extending the nanowires into the source access region 15b or drain access region 15d may limit the current capability of these regions and contribute to non-linearity. In some embodiments, The width $W_{wire}$ of a nanowire may be less than 500 nm, such as less than 250 nm, less than 125 nm, or less than 75 nm, and may be greater than 10 nm. However, the techniques described herein are not limited in this respect, as other suitable widths may be used. In some embodiments, the spacing s between nanowires may be between 20 nm and 1000 nm. However, the techniques described herein are not limited in this respect, as the techniques described herein are not limited to the spacing between nanowires. The embodiment shown in FIG. 7B shows the gate has a wrap-around configuration with gate material between respective nanowires. FIG. 7C shows a cross-sectional view of field effect transistor 31 along the line H-H' of FIG. 7A.

The nanowires may have any suitable cross-section, such as a square cross-section, a rectangular cross section, a rounded cross-section, or any other suitable cross-section. In some embodiments, the nanowires may have a fin-like shape. The techniques described herein are not limited as to the shape of nanowires that may be included in a field effect transistor.

Figure 8A:
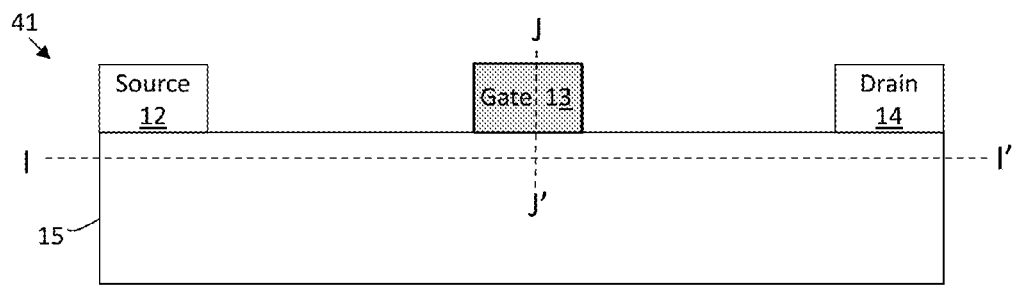
FIGS. 8A, 8B, and 8C show a semiconductor device with multiple channel regions under the gate separated by regions of limited conductivity.
Figure 8B:
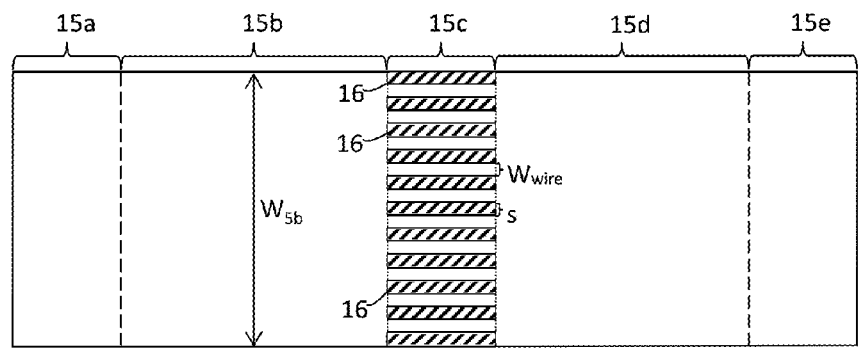
Figure 8C:
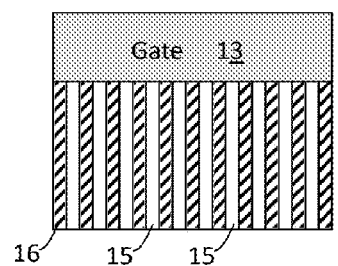

FIGS. 8A-8C show a field effect transistor 41 having regions of limited conductivity 16 between current-carrying regions under the gate, according to some embodiments. FIG. 8A shows a cross-sectional view and FIG. 8B shows a plan view along the line I-I' of the field effect transistor 41. Field effect transistor 41 may have a planar gate configuration, as shown in the cross-sectional view along line J-J' in FIG. 8C.

Any suitable materials and fabrication techniques may be used to form a field effect transistor.

Any suitable materials maybe used for the source and drain regions, 12, 14 such as metal(s) and/or doped semiconductor. The source and drain regions 12, 14 may have ohmic contacts. In some embodiments, the source region 12 and/or drain region 14 may be formed on the semiconductor region 15. In some embodiments, the source region 12 and drain region 14 may be recessed in the semiconductor region 15 by removing a portion of the semiconductor region 15 at the source and drain regions and filling the cavity with the materials used for the source and drain regions.

A gate 13 to control the transistor may be formed on the semiconductor region 15 or an optional insulating layer. The gate 13 may be formed of any suitable conductor or semiconductor, such as a metal or polysilicon. Optionally, a gate-recess technique may be used to increase the transconductance of the transistor or to form a normally-off transistor. However, the techniques described herein are not limited as to the source, gate and/or drain regions or particular techniques for fabricating them.

The semiconductor region 15 may be formed of a suitable semiconductor material(s). The semiconductor region 15 may include a compound semiconductor material, such as III-V semiconductor material (e.g., a III-N material). In some embodiments, a nitride semiconductor based transistor may be formed in which semiconductor region 15 includes a nitride semiconductor material. In some embodiments, a nitride semiconductor material may be used such as $B_wAl_x$-$In_yGa_zN$, for example, in which w, x, y and z each have any suitable value between zero and one (inclusive), and w+x+y+z=1. Examples of nitride semiconductor materials include GaN, AlN, AlGaN, InAlN, InAlGaN, and InGaN, by way of example and not limitation. In some embodiments, the semiconductor region 15 may include a gallium nitride (GaN) semiconductor material. However, the techniques herein are not limited to nitride semiconductor materials being included in semiconductor region 15, as other III-V or II-VI semiconductor materials or IV materials may be used. In some embodiments, semiconductor region 15 may be formed of a group IV semiconductor material such as silicon or germanium, for example.

The semiconductor region 15 may be monocrystalline, and may have any suitable orientation. Compound semiconductor materials, if included in semiconductor region 15, may have any suitable composition at the face of the semiconductor material. If a III-N material is included, it may have an N-face composition, a group III face composition or a non-polar orientation. For example, GaN may be grown either N-face and Ga-face or in non-polar orientations.

The semiconductor region 15 may be comprised of one or more materials, depending on the type of semiconductor device to be formed. The semiconductor region 15 may include one layer of a single material or more than one layer of different materials. In some embodiments, the semiconductor region 15 may include a heterostructure having a plurality of layers of different semiconductor materials. In some embodiments, the plurality of layers may be materials with of different bandgaps and/or polarizations, such as nitride semiconductor materials having different compositions, e.g., $B_{w1}Al_{x1}In_{y1}Ga_{z1}N$ and $B_{w2}Al_{x2}In_{y2}Ga_{z2}N$ materials. However, the techniques described herein are not limited as to the formation of heterostructures.

The semiconductor region 15 may be doped or undoped. If the semiconductor region 15 includes a region that is doped, it may be polarization doped or may include dopants such as n-type dopants or p-type dopants. If the semiconductor region 15 is doped, it may have any suitable doping concentration and distribution. If semiconductor region 15 is doped, any suitable doping technique may be used, such as implantation or diffusion, for example.

The reference herein to $B_wAl_xIn_yGa_zN$ or a "$B_wAl_xIn_y$-$Ga_zN$ material" refers to a semiconductor material having nitride and one or more of boron, aluminum, indium and gallium. Examples of $B_wAl_xIn_yGa_zN$ materials include GaN, AlN, AlGaN, AlInGaN, InGaN, and BAlInGaN, by way of illustration. A $B_wAl_xIn_yGa_zN$ material may include other materials besides nitride, boron, aluminum, indium and/or gallium. For example, a $B_wAl_xIn_yGa_zN$ material may be doped with a suitable dopant (e.g., silicon, germanium, etc.). The term "gallium nitride (GaN) semiconductor material" refers to a semiconductor material that includes gallium and nitrogen and does not exclude other elements of a III-N semiconductor from being present, such as boron, aluminum, and/or indium, for example, and does not exclude the presence of dopants.

Figure 8D:
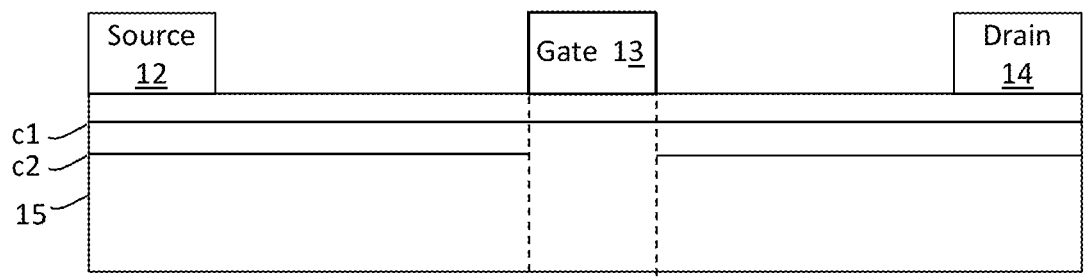
FIG. 8D shows an embodiment of a field effect transistor with multiple channels c1, c2 at different depths in the source access region.

Above has been describes techniques for limiting the amount of current that can flow under the gate by limiting the amount of current-carrying material under the gate. However, other techniques may be used to limit the current that can flow in the region under the gate, as an alternative to or in addition to limiting the amount of current-carrying material under the gate. For example, a semiconductor material under the gate may different from a material in an access region. For example, the semiconductor material under the gate may have a lower conductivity than the semiconductor material in the access region. As another example, a highly doped layer (e.g., a highly-doped semiconductor region) may be formed over a semiconductor material in the access region to supply carriers to the access region, thereby raising its current-carrying capability, and such a highly doped layer may not be formed over the semiconductor material under the gate. In an embodiment, a highly doped cap layer (e.g., n+ or p+ doped) may be formed only in the access region(s). As another example, multiple channels at different depths may be formed only in the access region to improve conductivity of the access region with respect to the region under the gate, which may have fewer channel(s). An embodiment of a field effect transistor with multiple channels c1, c2 at different depths in the source access region is illustrated in FIG. 8D. Layers of different semiconductor materials of different bandgaps, for example, may be used to form the channels at different depths.

FIGS. 9A-9H show a method of forming a field effect transistor with a plurality of current-carrying regions under the gate, according to some embodiments.

Figure 9A:
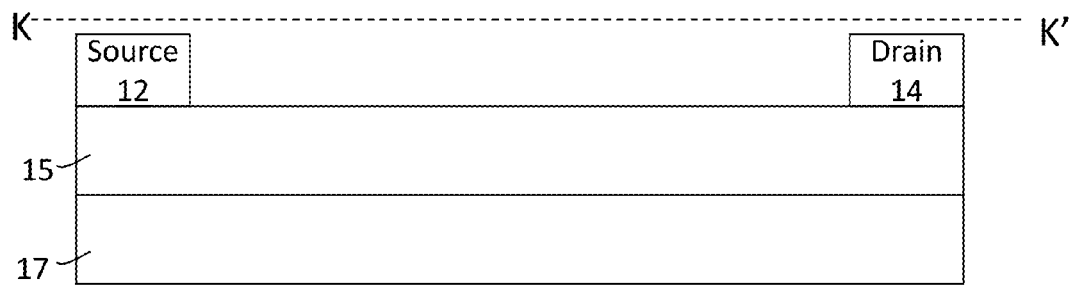
FIG. 9A-H show example steps of a fabrication process for forming multiple channel regions underneath the gate.
Figure 9B:
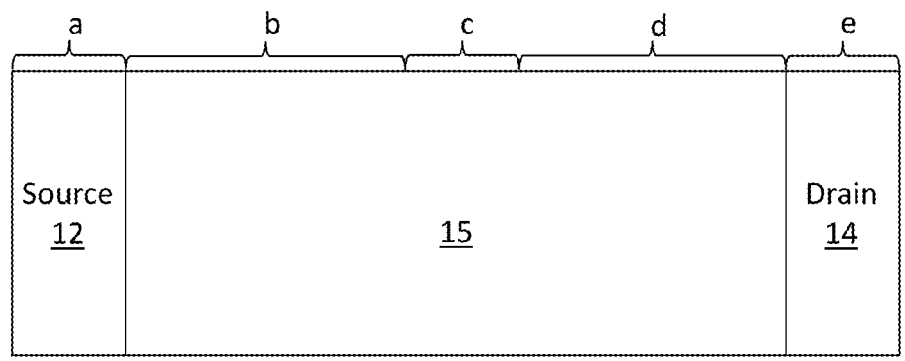

As shown in FIG. 9A, semiconductor region 15 may be formed over a semiconductor region 17. Source region 12 and drain region 14 may be formed on/in semiconductor region 15. FIG. 9B shows a plan view of the structure of FIG. 9A and indicates the source region a, source access region b, gate region c, drain access region d and drain region e.

Figure 9C:
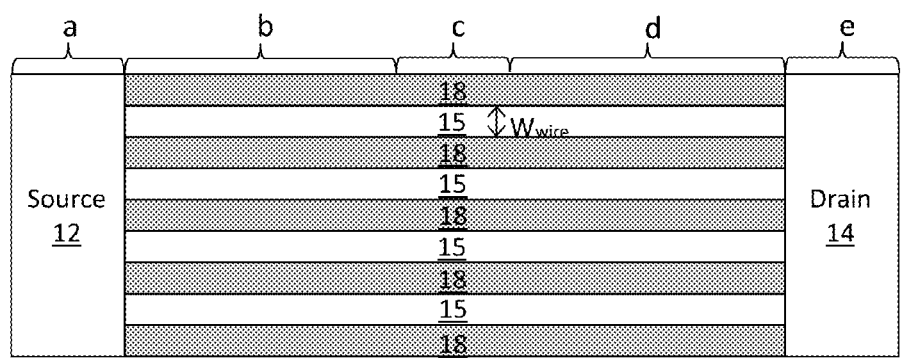
Figure 9D:
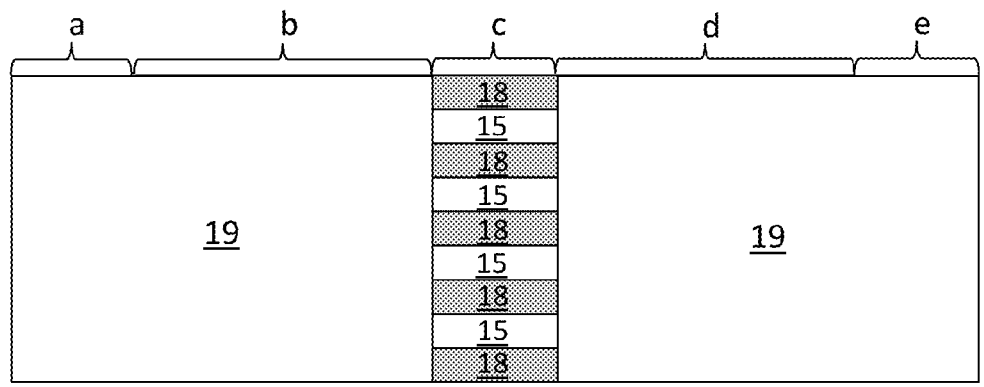
Figure 9E:
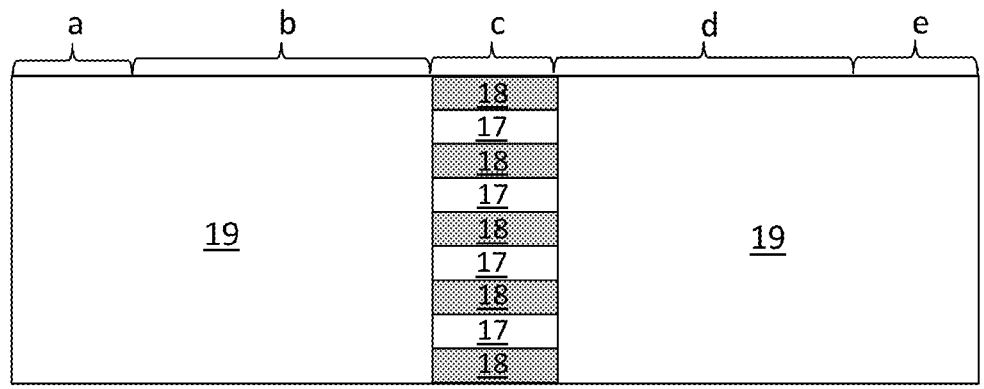
Figure 9F:
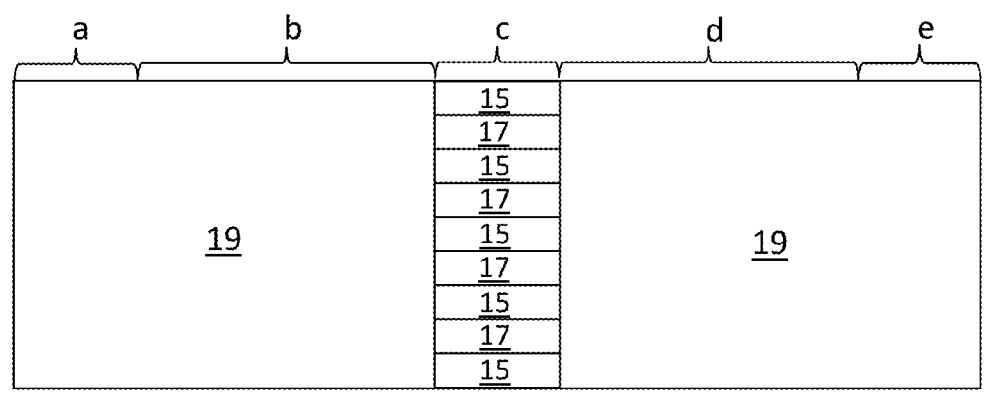
Figure 9G:
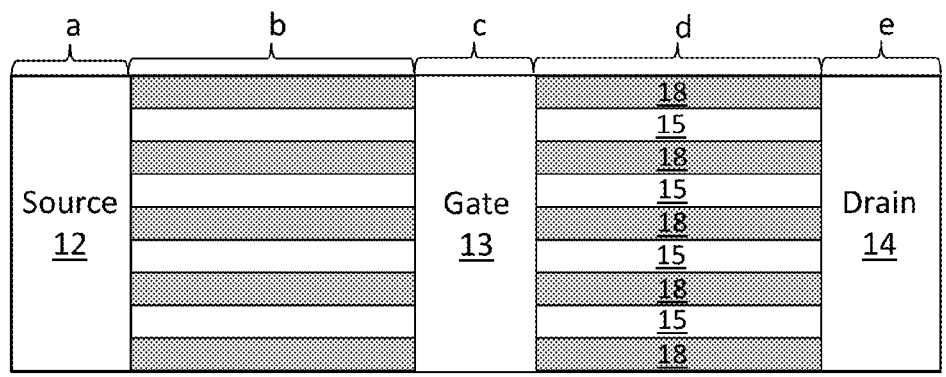
Figure 9H:
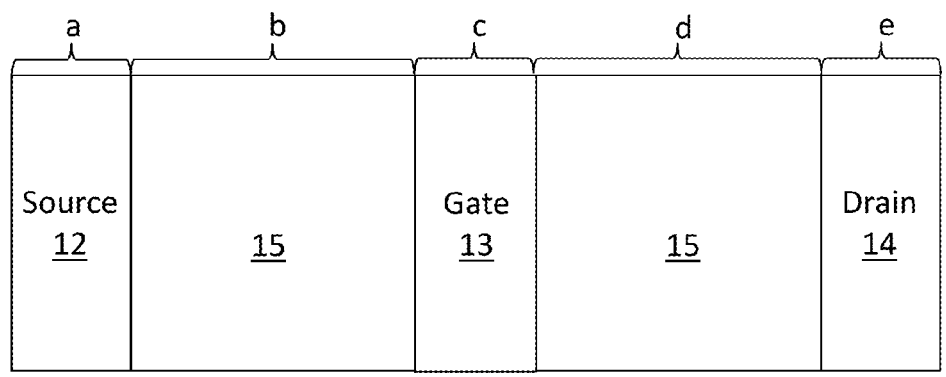

As shown in FIG. 9C, a mask layer 18 (e.g., a hard mask) may be formed over the semiconductor region 15 in a wire pattern in regions b, c, and d as shown in FIG. 9C. The mask layer 18 may be $Si_3N_4$, $SiO_2$ or any other suitable mask material. The mask layer 18 may be deposited and then a wire pattern may be formed in the semiconductor region 15 through lithography and subsequent etching (e.g., dry etching). In some embodiments, the mask layer 18 may be deposited with plasma-enhanced chemical vapor deposition (PECVD). However, any suitable deposition process may be used. The etching to form the wire pattern in mask layer 18 may use $CF_4$-based plasma or any other suitable etchant. The gate region c may then be defined using lithography. FIG. 9D shows that regions a, b, d, and e are covered with a resist material 19. Resist material 19 covers regions a, b, d, and e regions to protect them while the gate region c is selectively etched. The etching of the gate region c may be performed using $BCl_2/Cl_2$-based plasma dry etching or any other suitable etching process. In this example, the mask layer 18 is resistant to the etching and the exposed semiconductor region 15 is etched to the underlying semiconductor layer 17 in region c, as shown in FIG. 9E. Additionally or alternatively, ion implantation may be used to degrade the conductivity of the exposed portions of region 15 under the gate, thereby forming regions of limited conductivity 16, as discussed above. The wire patterns of the mask layer 18 protect the semiconductor region 15 thereunder. After etching and/or ion implantation, the mask layer 18 is removed to expose the protected channel regions, as shown in FIG. 9F. In some embodiments, the mask layer 18 may be removed with a $CF_4$-based plasma. The gate 13 is deposited over region c and the resist material 19 is removed as shown in FIG. 9G. The nanowire pattern formed by the hard mask material 18 is then removed in regions b and d to leave semiconductor region 15 exposed as shown in FIG. 9H. The mask layer 18 may be removed using wet etching. An additional step may be performed to form a passivation layer (not shown) over regions b, c, and d, leaving the source region 12 and drain region 14 exposed. The passivation layer may be $Al_2O_3$, in some embodiments. The passivation layer may be deposited by atomic layer deposition (ALD) or any other suitable process.

The foregoing is one example of a fabrication process that may be used to form a field effect transistor, and it should be appreciated that the techniques described herein are not limited in this respect, as any suitable fabrication process may be used.

Example

An example of a prototype device of the high linearity GaN transistor with a nanowire channel has been fabricated. A wafer grown on a SiC substrate by metal-organic chemical vapor deposition may be used. The heterostructure includes 10.3 nm of InAlN, 0.5 nm of AlN, and 1.8 μm of GaN. In the sample with 30 nm $Al_2O_3$ passivation, a 2-D charge density of $1.76 \times 10^{13}$, an electron mobility of 1233 $cm^2/V \cdot s$, and a sheet resistance of 288Ω/□ are obtained through Hall measurements.

The fabrication process begins with the selective source/drain regrowth with $n^+$ InGaN/GaN layers. After device isolation, 50 nm of $Si_3N_4$ is deposited with plasma-enhanced chemical vapor deposition (PECVD) and nanowire patterns are formed through e-beam lithography and subsequent dry etching with $CF_4/O_2$ plasma. Then, the second e-beam lithography is conducted to define the gate electrode. By using e-beam resist as a mask, the top InAlN and AlN barrier layers, as well as the first few nanometers of the GaN channel, are etched by a 25-30 nm deep $BCl_2/Cl_2$ plasma dry etching. During this etch process, the $Si_3N_4$ nanowire patterns protect the channel in the region that will form the nanowire channel. After the channel etching, the $Si_3N_4$ nanowire hard-mask is also removed with $CF_4/O_2$ plasma to expose the protected channel area. Then, gate metal including 10 nm Pt and 30 nm Au is deposited and lifted off by using the remaining e-beam resist. The SEM image in FIG. 10 shows the top view of the device after gate metallization. After removing the $Si_3N_4$ nanowire hard-mask on the access region with BOE wet etching, oxygen plasma is applied. Finally, 30 nm $Al_2O_3$ passivation layer was deposited by atomic layer deposition (ALD). For comparison, conventional devices with planar structure are also fabricated right next to the nanowire channel devices by skipping the $Si_3N_4$ nanowire patterning step. In some embodiments the gate contact may be made only on top of the active channel area by air bridge technology, which can reduce the fringing capacitance and increase the RF performance.

FIGS. 11A and 11B shows a comparison of the DC transfer and output characteristics of $L_g$=70-80 nm nanowire channel devices with conventional planar transistors. The DC characteristics of the nanowire channel devices are normalized with respect to the effective channel width ($W_{eff}=W_{wire} \times N_{wire}$, where $W_{wire}$ is wire width and $N_{wire}$ is total number of wires) in order to compare the intrinsic device performance. The device has 490 nanowires with about 88-nm width ($W_{eff}$=43.1 μm) and the spacing between nanowires ($W_{isol}$) is about 110-nm. As shown in FIG. 11A, the nanowire channel devices have much flatter extrinsic transconductance ($g_m$) than the planar device thanks to the relatively larger current drivability of their source access region. That is, even at high drain current, the source access region can provide enough current to the intrinsic device and it suppresses the non-linear access resistance effect by reducing the electric field in the region. This result suggests that the main cause of the peaky behavior of $g_m$ in the conventional planar GaN devices is the increase of the source resistance rather than optical phonon scattering even at short-channel devices with sub-100 nm gate length. The extrinsic $g_m$ of the nanowire channel device is larger than that of the planar device due to about 50% lower access and contact resistance resulting from the larger effective width of its source access region. The threshold voltage ($V_t$) is also shifted by about 1.4 V ($V_{ds}$=3V) in a positive direction due to the side gate effect.

Moreover, the suppression of the non-linear access resistance effect in the nanowire channel device allows realizing the real potential of current drivability in GaN HEMTs. In the conventional device, as the gate bias increases, the increase of the source resistance limits the effective gate overdrive ($V_{ov.eff}=V_{gs.eff}-I_{ds}\times R_s$), so that channel charge cannot increase linearly with the extrinsic gate bias ($V_{gs}$). Therefore, the maximum drain current of the conventional short-channel GaN devices is about 2~2.5 A/mm which is much smaller that the theoretical expectation based on the saturated electron velocity in these devices (4~5 A/mm). As shown in FIG. 11B, the maximum current density of the nanowire channel device goes above 3.5 A/mm ($V_{gs}$=1V) thanks to the constant source resistance even at the high drain current conditions. It shows that the intrinsic GaN device with proper source design can support such a high current density. Another advantage of the proposed structure is the potential to support a high breakdown voltage while maintaining high linearity. Since the constant source resistance need not be obtained through a self-aligned process, the gate-to-drain region may be scaled depending on the target breakdown voltage.

The RF characteristics of the nanowire channel devices are measured from 100 MHz to 40 GHz by using an Agilent N5430A network analyzer and the system is calibrated with an off-wafer LRRM calibration standard, and on-wafer open and short patterns are used to de-embed parasitic pad capacitances and inductances from the measured S-parameters. As shown in FIG. 12, the nanowire channel device has about 40% lower maximum current gain cutoff frequency ($f_T$) than the planar device due to the larger fringing capacitance from the side gate. However, due to its flatter $g_m$, the $f_T$ drop at high gate bias is significantly suppressed in the nanowire channel device while a serious degradation of $f_T$ is observed in the planar device. The uniform RF characteristic in the wide range of the bias can be very advantageous for large-signal RF applications by improving the linearity.

Additional Aspects

The techniques described herein may be applied to any type of field effect transistor such as MISFETs (Metal-Insulator Semiconductor Field Effect Transistor), and MESFETs (Metal-Semiconductor Field Effect Transistor) for example. In some embodiments, the techniques described herein may be applied to power transistors. Such techniques can provide improvements in power transistors that will enable significant improvements in power electronics systems for hybrid vehicles, high efficiency power inverters for solar cells, and power converters for LEDs, for example, as well as high-speed digital electronics.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A field effect transistor, comprising:
   a source;
   a drain;
   a gate; and
   a semiconductor region between the source and the drain, the semiconductor region having a source access region between the gate and the source, a drain access region between the gate and the drain, and a channel region under the gate that includes a two-dimensional electron gas extending across an entire length of the gate, wherein the channel region under the gate has a maximum current-carrying capability that is lower than a maximum current-carrying capability of the source access region.

2. The field effect transistor of claim 1, wherein the channel region under the gate has a smaller width than that of the source access region.

3. The field effect transistor of claim 1, wherein the channel region under the gate has a smaller current carrying cross-sectional area than that of the source access region.

4. The field effect transistor of claim 1, wherein the field effect transistor comprises a plurality of channel regions under the gate.

5. The field effect transistor of claim 4, wherein the plurality of channel regions under the gate includes nanowires of semiconductor material.

6. The field effect transistor of claim 5, wherein the nanowires do not extend beyond an area covered by the gate.

7. The field effect transistor of claim 1, further comprising at least one region of limited conductivity under the gate, between the source access region and the drain access region, the at least one region of limited conductivity having a lower conductivity that that of the channel region under the gate.

8. The field effect transistor of claim 7, wherein the at least one region of limited conductivity comprises at least one insulating region.

9. The field effect transistor of claim 1, wherein the semiconductor region comprises a nitride semiconductor material.

10. The field effect transistor of claim 9, wherein the nitride semiconductor material comprises a gallium nitride semiconductor material.

11. The field effect transistor of claim 1, wherein the source access region comprises a plurality of channels at different depths and the channel region under the gate has a smaller quantity of channels than a quantity of the plurality of channels.

12. The field effect transistor of claim 1, wherein the channel region under the gate has an amount of current-carrying semiconductor material that is lower than an amount of current-carrying semiconductor material of the source access region.

13. The field effect transistor of claim 1, wherein a source-drain current of the field effect transistor is not limited by the current-carrying capability of the source access region or the drain access region.

14. The field effect transistor of claim 1, wherein the channel region under the gate has a lower conductivity than that of the source access region.

15. The field effect transistor of claim 1, further comprising a doped region over the source access region and the drain access region and not over the channel region under the gate.

16. The field effect transistor of claim 1, wherein a semiconductor material under the gate is different from a material of the source access region or drain access region.

17. A field effect transistor, comprising:
a first electrode;
a second electrode;
a gate having a gate length;
a first channel region covered by the gate and extending across the gate length; and
a second channel region not covered by the gate, positioned between the first electrode and the gate,
wherein the first channel region has a first cross-section perpendicular to a line between the first electrode and the second electrode,
wherein the second channel region has a second cross-section perpendicular to the line between the first electrode and the second electrode,
wherein an area of the first cross-section of the first channel region is smaller than an area of the second cross-section of the second channel region, and
wherein the second channel region is wider than the first channel region in a width direction perpendicular to the line between the first electrode and the second electrode.

18. The field effect transistor of claim 17, wherein the first channel region comprises a nitride semiconductor material.

19. The field effect transistor of claim 18, wherein the nitride semiconductor material comprises a gallium nitride semiconductor material.

20. The field effect transistor of claim 17, wherein the first channel region comprises at least one nanowire.

21. The field effect transistor of claim 20, wherein the first channel region comprises a plurality of nanowires.

22. The field effect transistor of claim 20, wherein the at least one nanowire comprises a first nanowire having a fin-like shape.

23. The field effect transistor of claim 17, further comprising at least one insulating region under the gate.

24. The field effect transistor of claim 23, wherein the at least one insulating region comprises a region of damaged semiconductor material.

25. The field effect transistor of claim 17, wherein the first channel region includes a two-dimensional electron gas extending across the gate length.

* * * * *